(12) United States Patent
Okabe

(10) Patent No.: US 12,394,725 B2
(45) Date of Patent: Aug. 19, 2025

(54) ELECTRONIC COMPONENT, MODULE, AND METHOD OF MANUFACTURING ELECTRONIC COMPONENT

(71) Applicant: Murata Manufacturing Co., Ltd., Kyoto-fu (JP)

(72) Inventor: Ryohei Okabe, Nagaokakyo (JP)

(73) Assignee: MURATA MANUFACTURING CO., LTD., Kyoto-Fu (JP)

(*) Notice: Subject to any disclaimer, the term of this patent is extended or adjusted under 35 U.S.C. 154(b) by 423 days.

(21) Appl. No.: 18/169,976

(22) Filed: Feb. 16, 2023

(65) Prior Publication Data

US 2023/0197632 A1 Jun. 22, 2023

Related U.S. Application Data

(63) Continuation of application No. PCT/JP2021/029703, filed on Aug. 12, 2021.

(30) Foreign Application Priority Data

Aug. 26, 2020 (JP) .................................. 2020-142760

(51) Int. Cl.
*H01L 23/552* (2006.01)
*H01L 23/00* (2006.01)

(52) U.S. Cl.
CPC ............ *H01L 23/552* (2013.01); *H01L 24/10* (2013.01); *H01L 24/11* (2013.01); *H01L 24/13* (2013.01);
(Continued)

(58) Field of Classification Search
CPC .................................................. H01L 23/552
See application file for complete search history.

(56) References Cited

U.S. PATENT DOCUMENTS 6,285,079 B1 9/2001 Kunikiyo
2010/0327452 A1 12/2010 Kobayashi
(Continued)

FOREIGN PATENT DOCUMENTS

JP H11-345905 A 12/1999
JP 2003-243439 A 8/2003
(Continued)

OTHER PUBLICATIONS

International Search Report for PCT/JP2021/029703 dated Nov. 9, 2021.

*Primary Examiner* — William A Harriston
(74) *Attorney, Agent, or Firm* — McDonald Hopkins LLC

(57) ABSTRACT

An electronic component includes an electronic component main body including a first surface, a signal bump electrode arranged on the first surface to protrude from the first surface of the electronic component main body, and a protective film provided with an opening through which a part of the signal bump electrode is exposed, the protective film being arranged to cover a portion of the signal bump electrode other than a portion exposed through the opening. The protective film includes a first insulating film, a second insulating film that covers the first insulating film, and a first shield film arranged as lying between the first insulating film and the second insulating film. The first shield film is covered with at least one of the first insulating film and the second insulating film so as not to be exposed at an inner surface of the opening.

18 Claims, 11 Drawing Sheets

(52) U.S. Cl.
CPC .............. *H01L 24/14* (2013.01); *H01L 24/16* (2013.01); *H01L 2224/10122* (2013.01); *H01L 2224/1182* (2013.01); *H01L 2224/1183* (2013.01); *H01L 2224/1184* (2013.01); *H01L 2224/13014* (2013.01); *H01L 2224/13019* (2013.01); *H01L 2224/13022* (2013.01); *H01L 2224/14135* (2013.01); *H01L 2224/16227* (2013.01)

(56) References Cited

U.S. PATENT DOCUMENTS

| | | | |
|---|---|---|---|
| 2012/0292490 A1 | 11/2012 | Sanson | |
| 2019/0013347 A1 | 1/2019 | Kobayashi | |
| 2020/0168543 A1* | 5/2020 | Shih | H01L 23/5283 |
| 2020/0373259 A1* | 11/2020 | Koller | H01L 21/4853 |

FOREIGN PATENT DOCUMENTS

| | | | |
|---|---|---|---|
| JP | 2008-108868 A | 5/2008 |
| JP | 2009-059819 A | 3/2009 |
| JP | 2013-008952 A | 1/2013 |
| WO | 2009/110355 A1 | 9/2009 |
| WO | 2017/175376 A1 | 10/2017 |

\* cited by examiner

ELECTRONIC COMPONENT, MODULE, AND METHOD OF MANUFACTURING ELECTRONIC COMPONENT

CROSS REFERENCE TO RELATED APPLICATION

This is a continuation of International Application No. PCT/JP2021/029703 filed on Aug. 12, 2021 which claims priority from Japanese Patent Application No. 2020-142760 filed on Aug. 26, 2020. The contents of these applications are incorporated herein by reference in their entireties.

BACKGROUND OF THE DISCLOSURE

Field of the Disclosure

The present disclosure relates to an electronic component, a module, and a method of manufacturing an electronic component.

Description of the Related Art

Japanese Patent Laying-Open No. 2008-108868 (PTL 1) describes a structure including a protruding electrode. A conductive layer is formed on a surface of a protruding body composed of a resin. An opposing electrode provided in a substrate is pressed against the protruding electrode.

Japanese Patent Laying-Open No. 2009-59819 (PTL 2) describes a structure including a conductive terminal provided to protrude from an interconnection layer.

PTL 1: Japanese Patent Laying-Open No. 2008-108868
PTL 2: Japanese Patent Laying-Open No. 2009-59819

BRIEF SUMMARY OF THE DISCLOSURE

A module may be made by mounting an electronic component on a substrate. A signal line is arranged on the substrate of the module. Signal noise is generated from the signal line. Since the signal noise is generated from the signal line located on the surface of the substrate, a shield film is required for preventing influence on the electronic component by the signal noise.

A possible benefit of the present disclosure is to provide an electronic component capable of cutting off noise generated from a substrate, a module, and a method of manufacturing an electronic component.

In order to achieve the possible benefit above, an electronic component based on the present disclosure includes an electronic component main body including a first surface, a signal bump electrode arranged on the first surface to protrude from the first surface of the electronic component main body, and a protective film provided with an opening through which a part of the signal bump electrode is exposed, the protective film being arranged to cover a portion of the signal bump electrode other than a portion exposed through the opening. The protective film includes a first insulating film, a second insulating film that covers the first insulating film, and a first shield film arranged as lying between the first insulating film and the second insulating film. The first shield film is covered with at least one of the first insulating film and the second insulating film so as not to be exposed at an inner surface of the opening.

According to the present disclosure, an electronic component capable of cutting off noise generated from a substrate can be realized.

DETAILED DESCRIPTION OF THE DISCLOSURE

Figure 1:
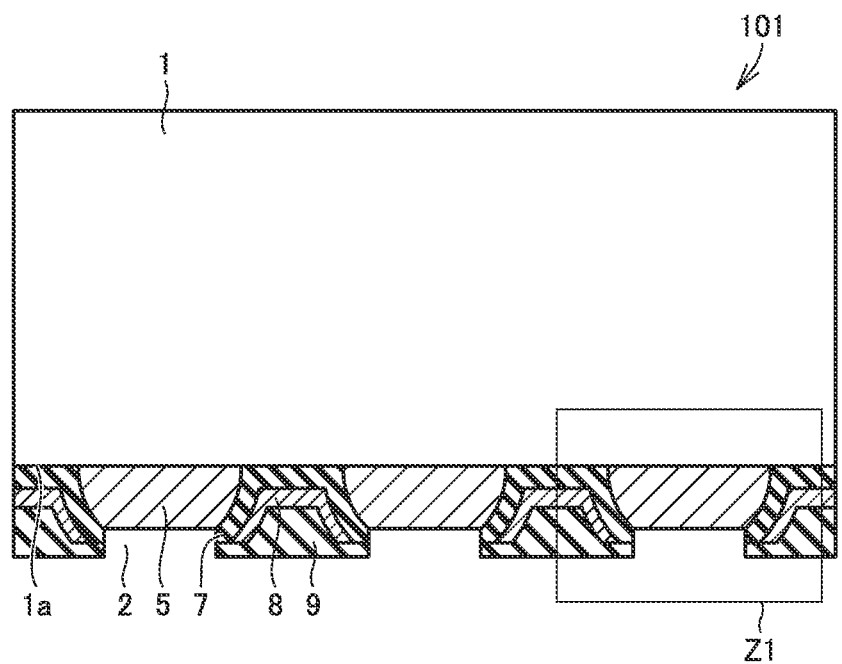
FIG. 1 is a cross-sectional view of an electronic component in a first embodiment based on the present disclosure.

A dimensional ratio shown in the drawings does not necessarily faithfully represent an actual dimensional ratio and a dimensional ratio may be exaggerated for the sake of convenience of description. A concept up or upper or down or lower mentioned in the description below does not mean absolute up or upper or down or lower but may mean relative up or upper or down or lower in terms of a shown position.

First Embodiment

Figure 2:
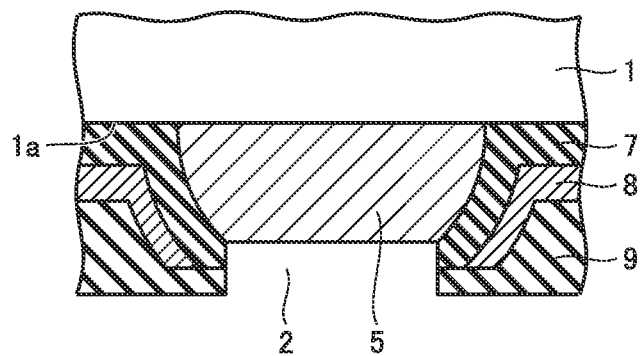
FIG. 2 is an enlarged view of a Z1 portion in FIG. 1.

An electronic component in a first embodiment based on the present disclosure will be described with reference to FIGS. 1 to 2. FIG. 1 shows a cross-sectional view of an electronic component 101 in the present embodiment. FIG. 2 shows a Z1 portion in FIG. 1 as being enlarged.

Electronic component 101 includes an electronic component main body 1 including a first surface 1a, a signal bump electrode 5 arranged on first surface 1a to protrude from first surface 1a of electronic component main body 1, and a protective film provided with an opening 2 through which a part of signal bump electrode 5 is exposed, the protective film being arranged to cover a portion of signal bump electrode 5 other than a portion exposed through opening 2. The protective film includes a first insulating film 7, a second insulating film 9 that covers first insulating film 7, and a first shield film 8 arranged as lying between first insulating film 7 and second insulating film 9. First shield film 8 is covered with at least one of first insulating film 7 and second insulating film 9 so as not to be exposed at an inner surface of opening 2. In an example shown here, a lower surface of electronic component main body 1 is defined as first surface 1a. Signal bump electrode 5 is an electrode provided to exchange any electrical signal. Signal bump electrode 5 may be formed, for example, of solder. Signal bump electrode 5 may be formed, for example, as an electrode in a form of a ball.

As shown in FIG. 1, the protective film is arranged to cover a side surface of signal bump electrode 5.

Since signal bump electrode 5 is arranged on first surface 1a in the present embodiment, first surface 1a can be concluded as a mount surface. Since the protective film is provided on the mount surface and the protective film includes first shield film 8, first shield film 8 can cut off noise generated from the substrate. In other words, the electronic component capable of cutting off noise generated from the substrate can be realized. Since first shield film 8 is not exposed at the inner surface of opening 2, short-circuiting to first shield film 8 in electrical connection to signal bump electrode 5 through opening 2 can be avoided.

As shown in the present embodiment, a distance between an end of first shield film 8 closest to opening 2 and first surface 1a is preferably longer than a distance between a point of signal bump electrode 5 most distant from first surface 1a and first surface 1a. By adopting this construction, signal bump electrode 5 can more reliably be shielded by first shield film 8.

As shown in the present embodiment, when signal bump electrode 5 and the protective film are viewed in a direction perpendicular to first surface 1a, signal bump electrode 5 and first shield film 8 preferably include an overlapping portion. By adopting this construction, signal bump electrode 5 can more reliably be shielded.

Second Embodiment

Figure 3:
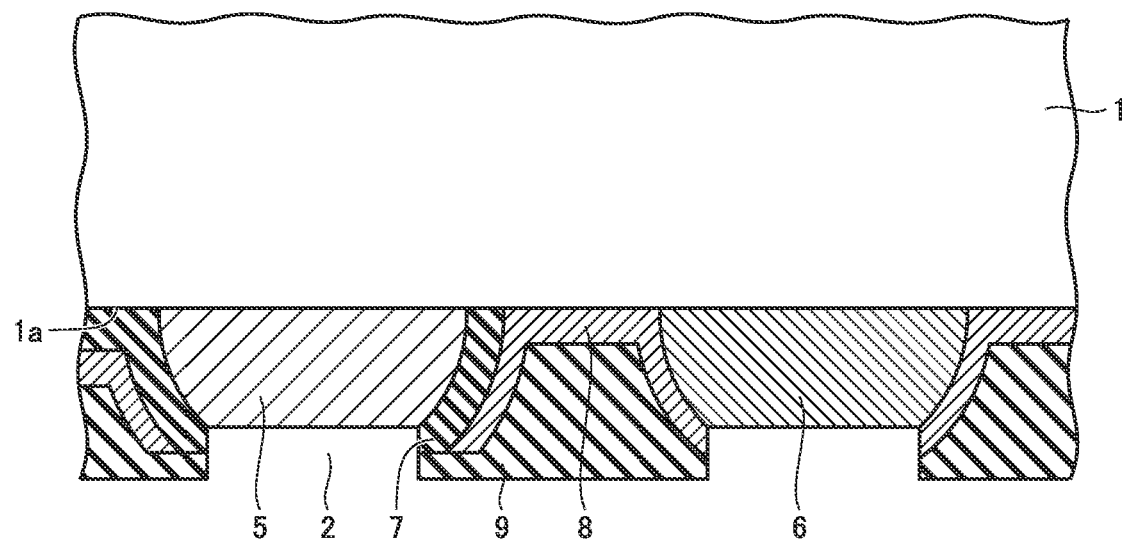
FIG. 3 is a partially enlarged cross-sectional view of an electronic component in a second embodiment based on the present disclosure.

An electronic component in a second embodiment based on the present disclosure will be described with reference to FIG. 3. FIG. 3 shows a partially enlarged cross-sectional view of the electronic component in the present embodiment. The electronic component in the present embodiment is constructed as described in the first embodiment and further constructed as below.

This electronic component includes a ground bump electrode 6 connected to a portion of electronic component main body 1 to be set to a ground potential and arranged to protrude from first surface 1a. First shield film 8 is electrically connected to ground bump electrode 6. Ground bump electrode 6 may be formed of a material identical to that for signal bump electrode 5. Ground bump electrode 6 may be formed in a shape the same as that of signal bump electrode 5. Unlike signal bump electrode 5 provided to exchange an electrical signal, ground bump electrode 6 is provided to be set to the ground potential.

The electronic component in the present embodiment can achieve the effect described in the first embodiment, and furthermore, the portion of electronic component main body 1 to be set to the ground potential can efficiently be grounded through ground bump electrode 6.

Third Embodiment

Figure 4:
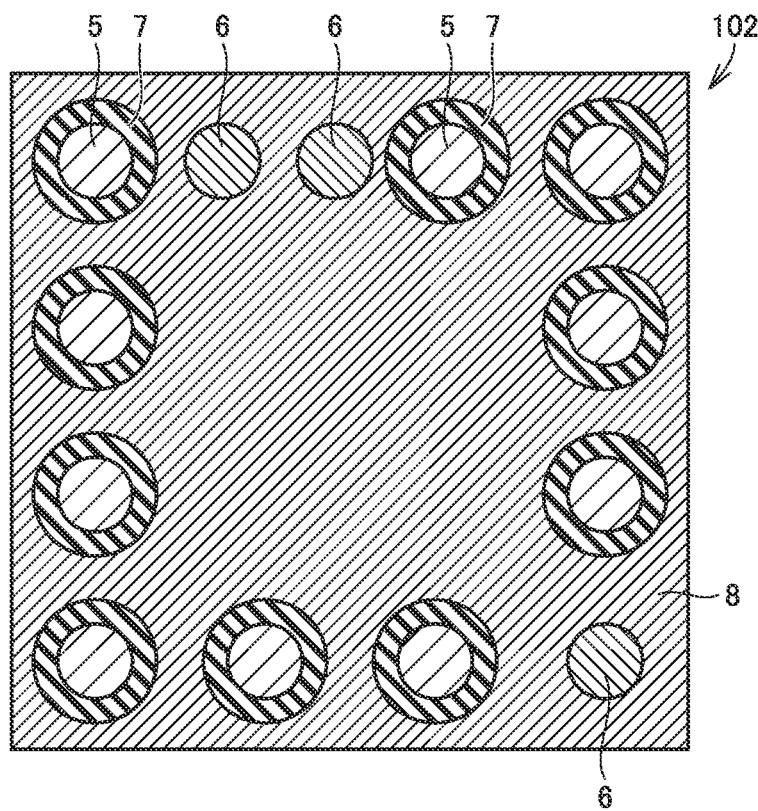
FIG. 4 is a perspective plan view of a mount surface on which an electronic component is mounted in a third embodiment based on the present disclosure.

An electronic component in a third embodiment based on the present disclosure will be described with reference to FIG. 4. FIG. 4 shows a view of a mount surface where an electronic component 102 is mounted in the present embodiment. FIG. 4 shows a perspective plan view for the sake of convenience of description. In other words, FIG. 4 shows the protective film from which elements other than first shield film 8 have been removed. Therefore, in FIG. 4, first shield film 8 is seen in many portions. Electronic component 102 is constructed as described in the second embodiment and further constructed as below.

Electronic component 102 has an outer geometry in a square shape when viewed two-dimensionally. In electronic component 102, a plurality of bump electrodes are disposed around an outer edge. The plurality of bump electrodes include a plurality of signal bump electrodes 5 and a plurality of ground bump electrodes 6. In each of the plurality of signal bump electrodes 5, first shield film 8 is spaced apart from signal bump electrode 5. In each of the plurality of ground bump electrodes 6, first shield film 8 is in contact with ground bump electrode 6.

The present embodiment can also achieve the effect as described in the second embodiment.

Though the two-dimensionally viewed outer geometry of the electronic component is described as being in the square shape in the present embodiment, this is merely by way of example. The two-dimensionally viewed outer geometry of the electronic component may be in another shape. The two-dimensionally viewed outer geometry may be, for example, in a rectangular shape or a polygonal shape.

Fourth Embodiment

Figure 5:
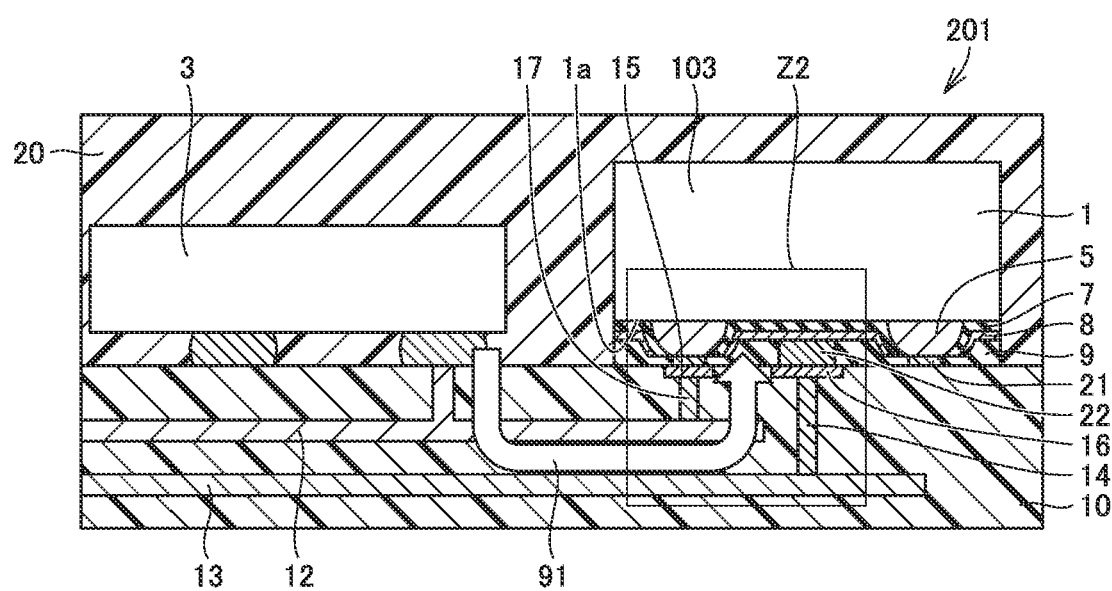
FIG. 5 is a cross-sectional view of a module in a fourth embodiment based on the present disclosure.
Figure 6:
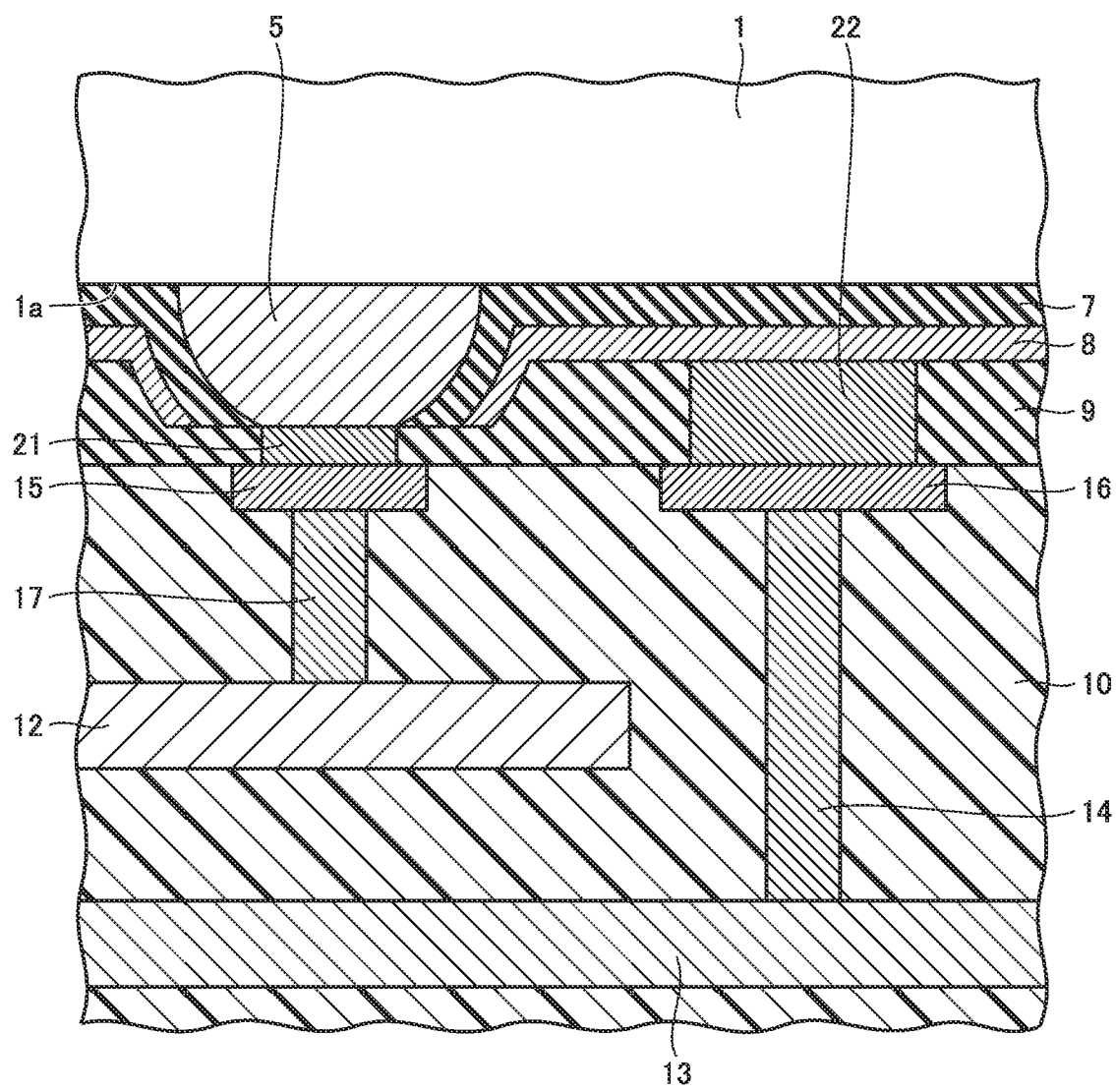
FIG. 6 is an enlarged view of a Z2 portion in FIG. 5.

A module 201 in a fourth embodiment based on the present disclosure will be described with reference to FIGS. 5 to 6. FIG. 5 shows a cross-sectional view of module 201 in the present embodiment. FIG. 6 shows a Z2 portion in FIG. 5 as being enlarged.

Module 201 includes a substrate 10 including a signal electrode 15 and a ground electrode 16 and an electronic component 103. Electronic component 103 is mounted on substrate 10. A signal line 12 and a ground line 13 are arranged in the inside of substrate 10. Ground line 13 is connected to ground electrode 16 provided on a surface of substrate 10 through a ground via conductor 14. Signal bump electrode 5 exposed through opening 2 in electronic component 103 is electrically connected to signal electrode 15 through solder 21. First shield film 8 is electrically connected to ground electrode 16 through solder 22. Second insulating film 9 is provided with an opening to expose first shield film 8. Solder 22 is arranged to fill in this opening. A component 3 is also mounted on the surface of substrate 10. A sealing resin 20 is arranged on the surface of substrate 10 so as to cover component 3 and electronic component 103.

In electronic component 103, first shield film 8 includes a structure for electrical connection to ground electrode 16 arranged on substrate 10 on which electronic component 103 is mounted. The "structure for electrical connection to ground electrode 16" refers to a portion exposed at second insulating film 9 in this case. In electronic component 103, first shield film 8 includes such a portion exposed for connection as the "structure for electrical connection to ground electrode 16."

The present embodiment can also achieve the effect as described in the first embodiment. In the present embodiment, first shield film 8 and a portion of substrate 10 at the ground potential can be connected to each other also in a portion where no bump electrode is arranged.

In module 201 in the present embodiment, propagation of noise to electronic component main body 1 when noise propagates as shown with an arrow 91 can be cut off by first shield film 8.

Though signal bump electrode 5 is connected to signal electrode 15 through solder 21 in the present embodiment, the signal bump electrode may be connected, for example, with the use of a conductive resin adhesive containing Cu or Ag instead of solder 21.

Though module 201 including electronic component 103 is shown, any electronic component described so far may be provided instead of electronic component 103. Any electronic component described so far may be mounted on the surface of substrate 10. A single module may contain a plurality of electronic components. Electronic components different in type may be combined and mounted on the surface of one common substrate.

Fifth Embodiment

A method of manufacturing an electronic component in a fifth embodiment based on the present disclosure will be described with reference to FIGS. 7 to 15.

The method of manufacturing an electronic component in the present embodiment includes preparing a first structure body including an electronic component main body including a first surface and a signal bump electrode arranged on the first surface to protrude from the first surface of the electronic component main body, forming a first insulating film to cover the first surface of the first structure body and the signal bump electrode, forming a first shield film to cover the first insulating film, performing grinding so as to expose a part of the signal bump electrode, arranging a sacrificial layer to cover an exposed portion of the signal bump electrode, forming a second insulating film to cover the first shield film and the sacrificial layer, and partially exposing the signal bump electrode by removing a portion of the second insulating film superimposed on the sacrificial layer and the sacrificial layer.

Each step in this manufacturing method will be described in detail below with reference to the drawings.

Initially, the first structure body including electronic component main body 1 including first surface 1a and signal bump electrode 5 arranged on first surface 1a to protrude from first surface 1a of electronic component main body 1 is prepared.

Figure 7:
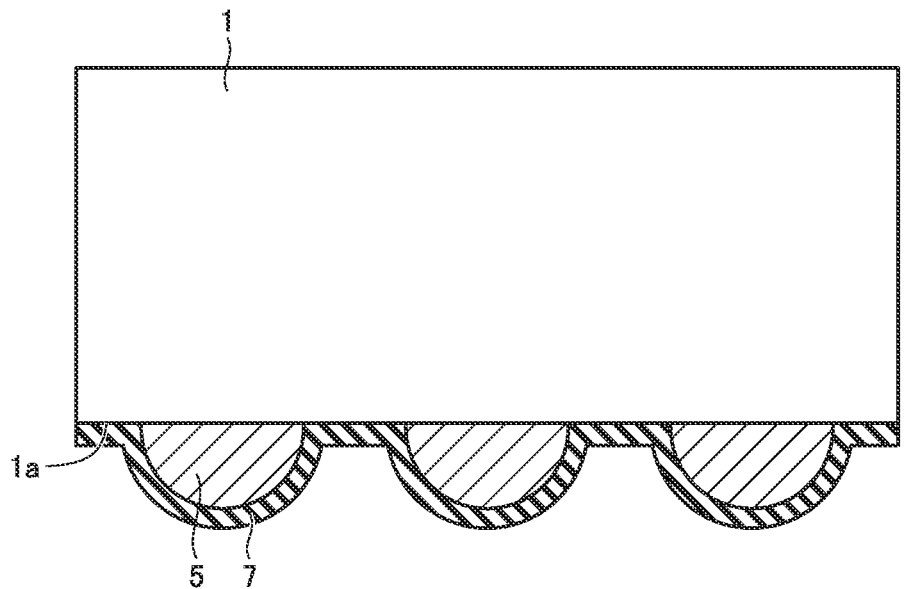
FIG. 7 is an illustrative view of a first step in a method of manufacturing an electronic component in a fifth embodiment based on the present disclosure.
Figure 8:
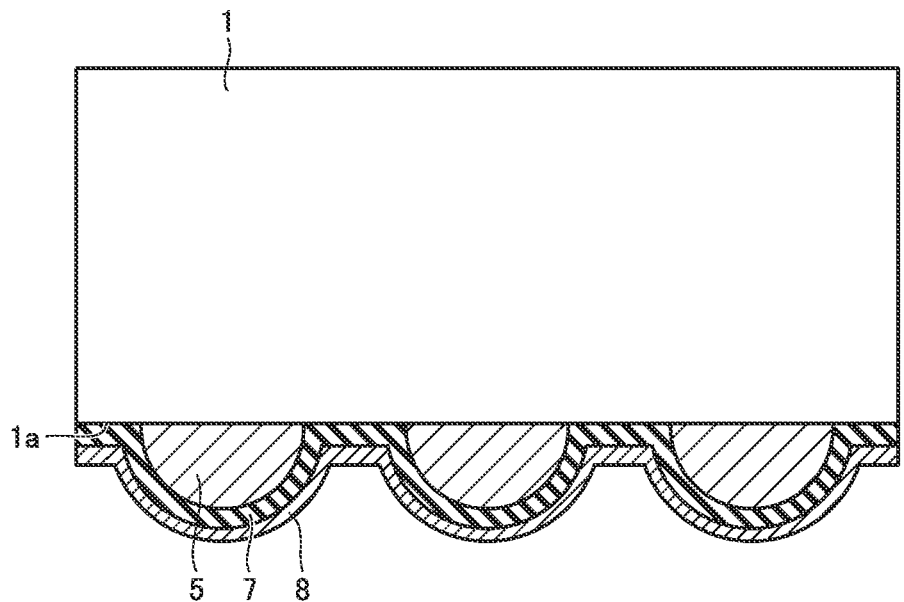
FIG. 8 is an illustrative view of a second step in the method of manufacturing an electronic component in the fifth embodiment based on the present disclosure.
Figure 9:
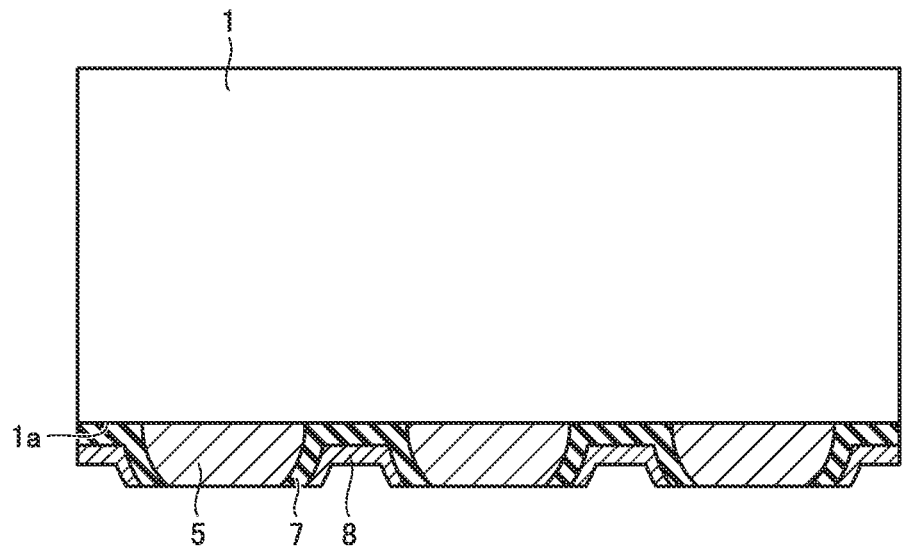
FIG. 9 is an illustrative view of a third step in the method of manufacturing an electronic component in the fifth embodiment based on the present disclosure.

Then, as shown in FIG. 7, first insulating film 7 is formed to cover first surface 1a of the first structure body and signal bump electrode 5. As shown in FIG. 8, first shield film 8 is formed to cover first insulating film 7. As shown in FIG. 9, grinding is performed to expose a part of signal bump electrode 5.

Figure 10:
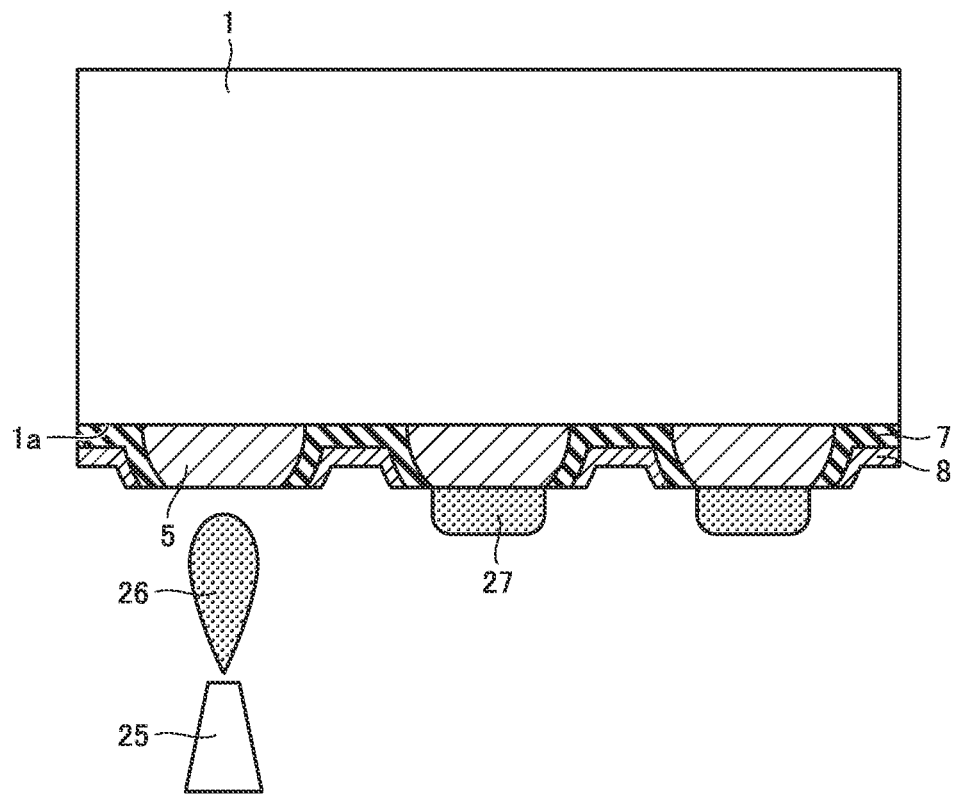
FIG. 10 is an illustrative view of a first example of a fourth step in the method of manufacturing an electronic component in the fifth embodiment based on the present disclosure.

Then, as shown in FIG. 10, a sacrificial layer 27 is arranged to cover an exposed portion of signal bump electrode 5. In FIG. 10, sacrificial layer 27 is formed by an ink jet method as a first example of this step. Specifically, a resin droplet 26 is ejected from an ink jet nozzle 25. As this resin droplet 26 adheres to a desired area, sacrificial layer 27 is formed. By thus adopting the ink jet method, sacrificial layer 27 can be formed to cover the exposed portion of signal bump electrode 5.

Figure 11:
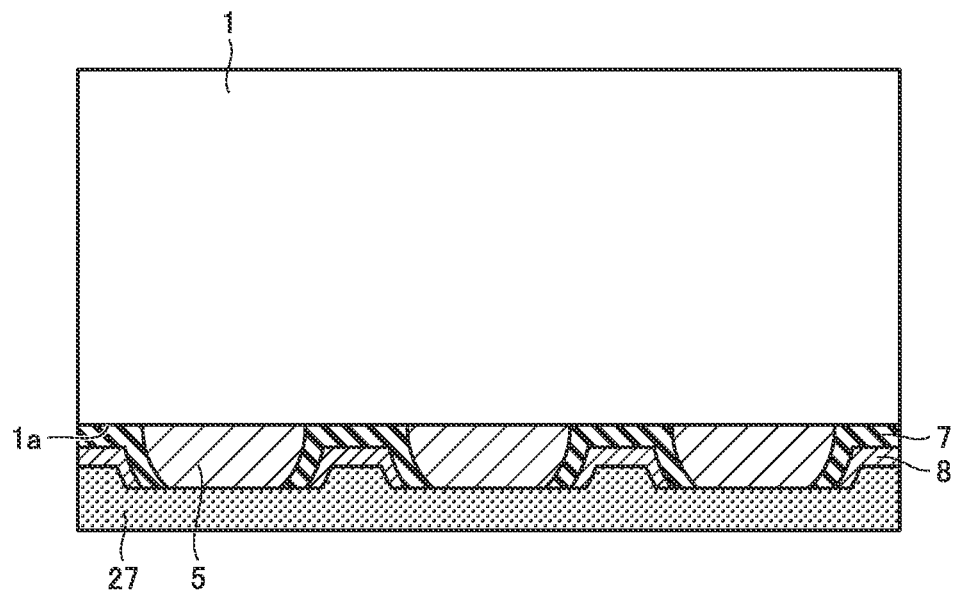
FIG. 11 is a first illustrative view of a second example of the fourth step in the method of manufacturing an electronic component in the fifth embodiment based on the present disclosure.
Figure 12:
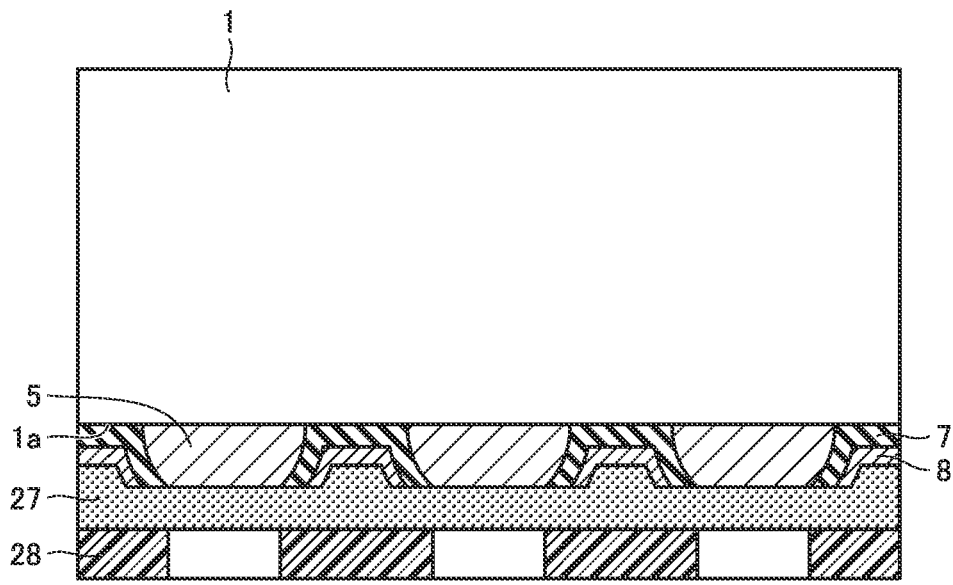
FIG. 12 is a second illustrative view of the second example of the fourth step in the method of manufacturing an electronic component in the fifth embodiment based on the present disclosure.
Figure 13:
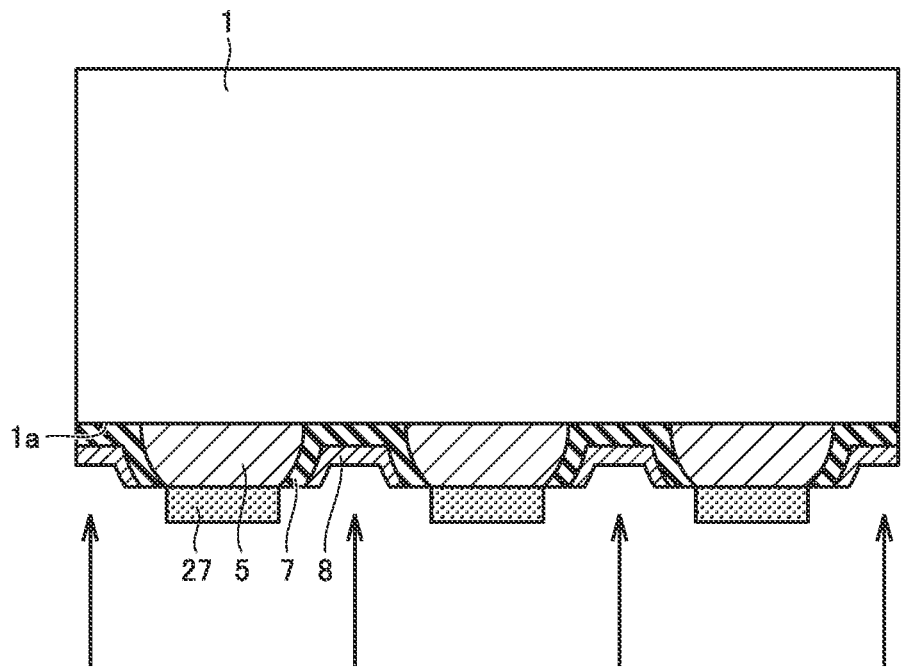
FIG. 13 is a third illustrative view of the second example of the fourth step in the method of manufacturing an electronic component in the fifth embodiment based on the present disclosure.

As shown in FIGS. 11 to 13, photolithography may be adopted as a second example of this step. In this case, a photoresist material is employed for sacrificial layer 27. Initially, as shown in FIG. 11, sacrificial layer 27 is formed to cover the entire area of the mount surface. The portion where signal bump electrode 5 is exposed is also covered with sacrificial layer 27. As shown in FIG. 12, a photomask 28 is overlaid and laser beams 29 are emitted. Photomask 28 is provided with an opening in conformity with the area where signal bump electrode 5 is exposed. Laser beams 29 are incident on sacrificial layer 27 through the opening. Sacrificial layer 27 is locally exposed in this portion. As shown in FIG. 13, photomask 28 is removed and a portion of sacrificial layer 27 other than the exposed portion is removed, which can be done by immersion in a developer. An arrow in FIG. 13 represents supply of the developer. Sacrificial layer 27 can thus be formed to cover the exposed portion of signal bump electrode 5 as shown in FIG. 13.

Figure 14:
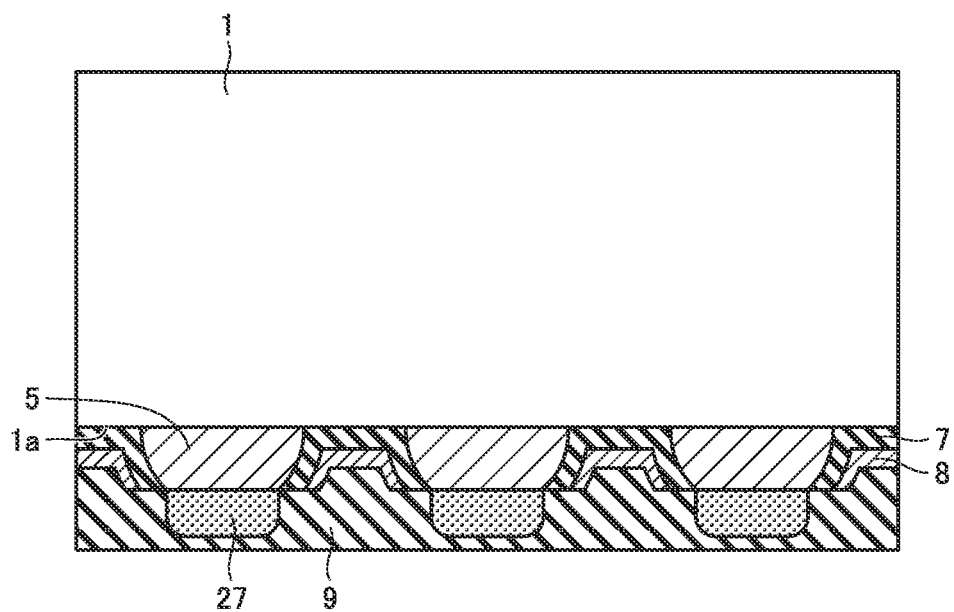
FIG. 14 is an illustrative view of a fifth step in the method of manufacturing an electronic component in the fifth embodiment based on the present disclosure.

In any of the first example and the second example where sacrificial layer 27 is formed, second insulating film 9 is then formed to cover first shield film 8 and sacrificial layer 27 as shown in FIG. 14.

Figure 15:
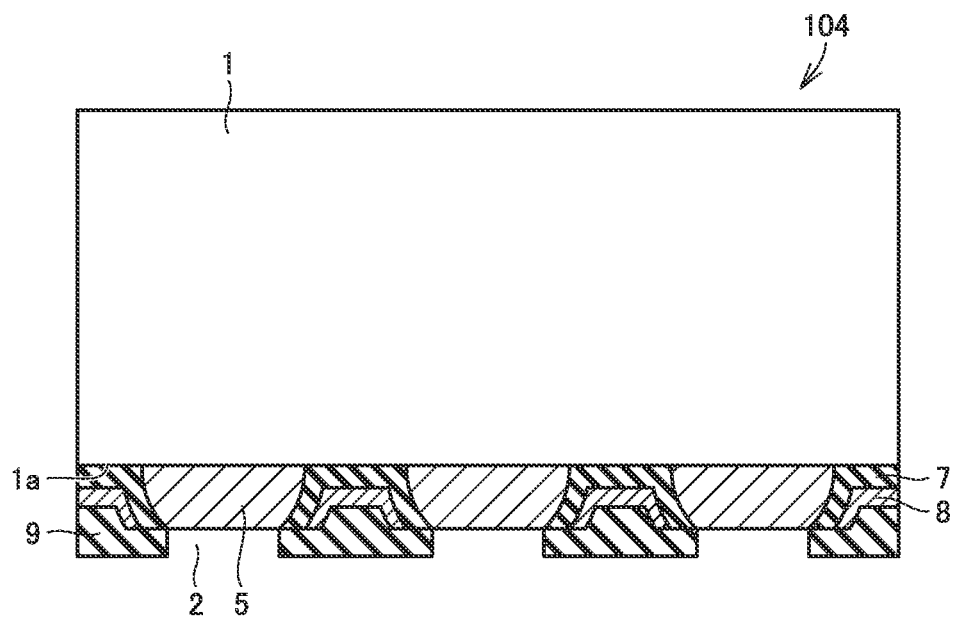
FIG. 15 is an illustrative view of a sixth step in the method of manufacturing an electronic component in the fifth embodiment based on the present disclosure.

Then, as shown in FIG. 15, a portion of second insulating film 9 superimposed on sacrificial layer 27 and sacrificial layer 27 are removed to partially expose signal bump electrode 5. For removal of sacrificial layer 27, for example, second insulating film 9 may be ground until sacrificial layer 27 is exposed and thereafter sacrificial layer 27 may be removed with an alkali aqueous solution or an organic solvent such as acetone. An electronic component 104 can thus be obtained.

According to the manufacturing method in the present embodiment, the electronic component constructed as described in the first embodiment can be obtained. Specifically, the electronic component capable of cutting off noise generated from the substrate can be obtained.

Figure 16:
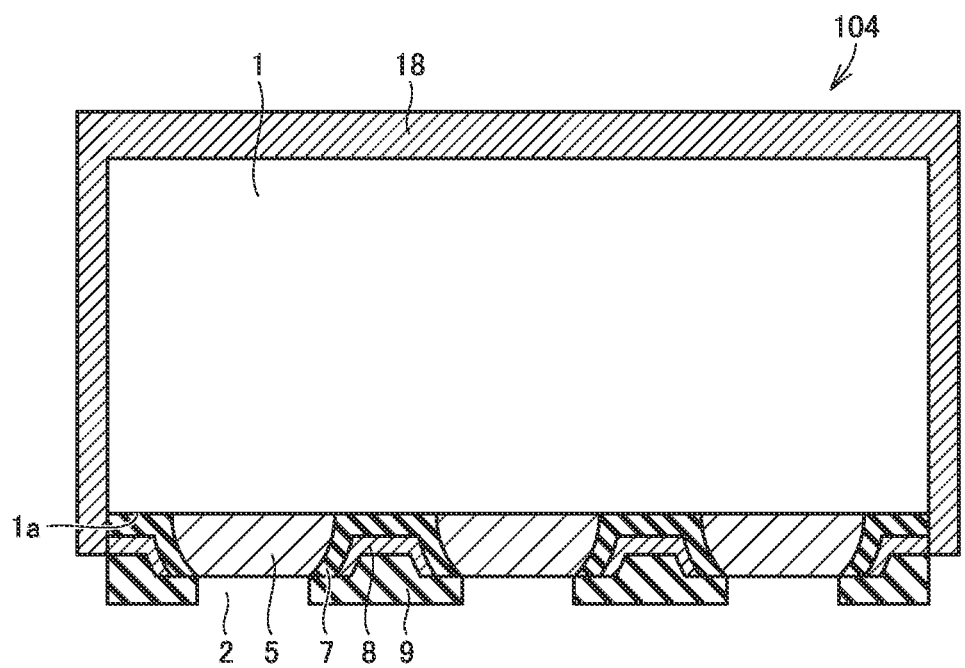
FIG. 16 is a cross-sectional view of a modification of an electronic component obtained with the method of manufacturing an electronic component in the fifth embodiment based on the present disclosure.

As shown in FIG. 16, a second shield film 18 may be formed to cover an upper surface and a side surface of electronic component main body 1. By adopting this construction, exchange of electromagnetic waves to a portion above electronic component main body 1 and a portion lateral to electronic component main body 1 can be cut off by second shield film 18. Therefore, noise can more reliably be prevented. Incoming noise to electronic component main body 1 can be prevented and outgoing noise from electronic component main body 1 can also be prevented.

Sixth Embodiment

A method of manufacturing an electronic component in a sixth embodiment based on the present disclosure will be described with reference to FIGS. 7 to 9 and FIGS. 17 to 19.

The method of manufacturing an electronic component in the present embodiment includes preparing a first structure body including an electronic component main body including a first surface and a bump electrode arranged on the first surface to protrude from the first surface of the electronic component main body, forming a first insulating film to cover the first surface of the first structure body and the signal bump electrode, forming a first shield film to cover the first insulating film, performing grinding so as to expose a part of the signal bump electrode, forming a second insulating film to cover the first shield film and an exposed portion of the signal bump electrode, and partially exposing the signal bump electrode by partially removing the second insulating film with laser machining.

Each step in this manufacturing method will be described in detail below with reference to the drawings.

The process until the steps shown in FIGS. 7 to 9 in this manufacturing method is the same as described in the fifth embodiment. Specifically, the process until grinding to expose a part of signal bump electrode 5 as shown in FIG. 9 is the same as in the manufacturing method described in the fifth embodiment.

Figure 17:
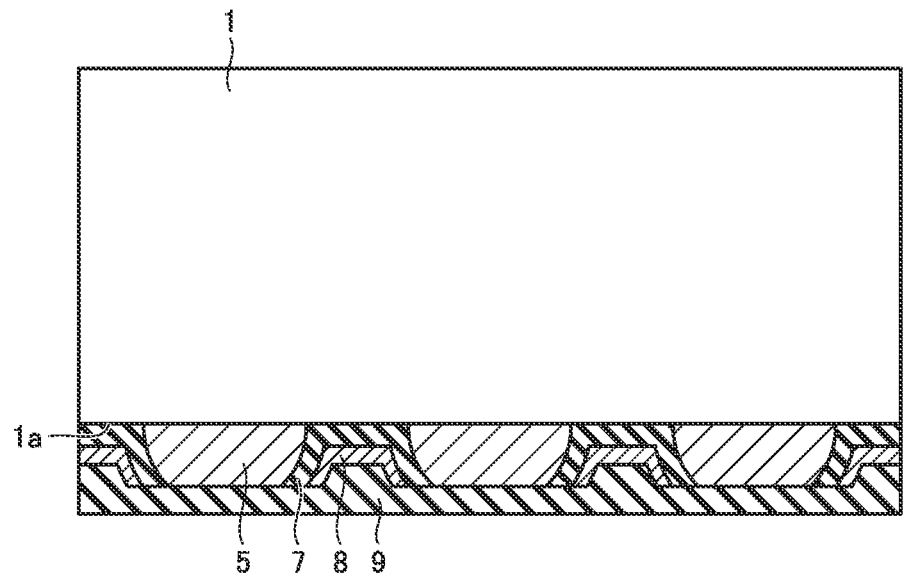
FIG. 17 is an illustrative view of a first step in the method of manufacturing an electronic component in a sixth embodiment based on the present disclosure.
Figure 18:
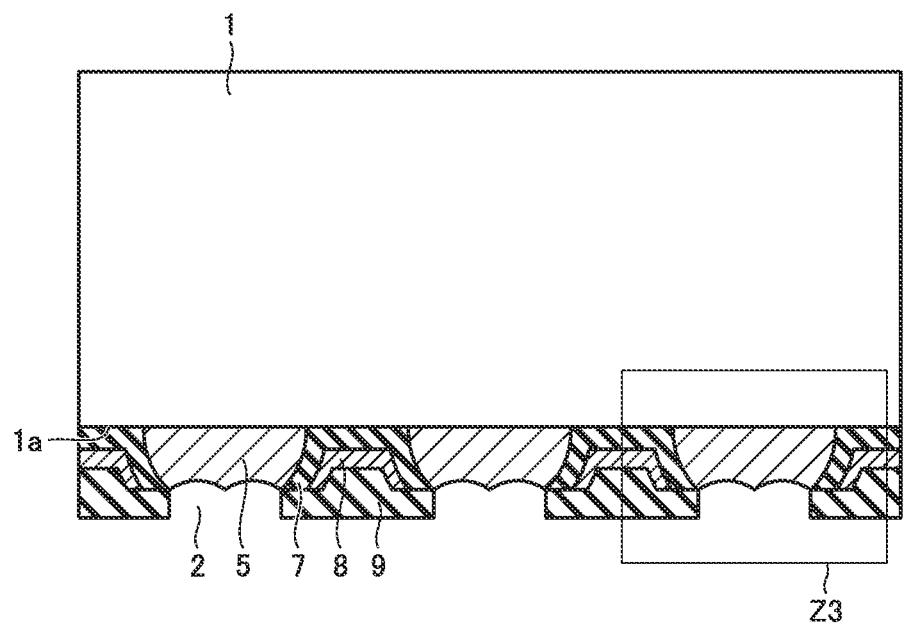
FIG. 18 is an illustrative view of a second step in the method of manufacturing an electronic component in the sixth embodiment based on the present disclosure.

Then, as shown in FIG. 17, second insulating film 9 is formed to cover signal bump electrode 5 and first shield film 8. Furthermore, as shown in FIG. 18, an area corresponding to signal bump electrode 5 is irradiated with laser beams to provide opening 2. In the area irradiated with laser beams, second insulating film 9 is removed and a part of signal bump electrode 5 is also further removed. In other words, signal bump electrode 5 is dug down to some extent. The electronic component is thus obtained.

Figure 19:
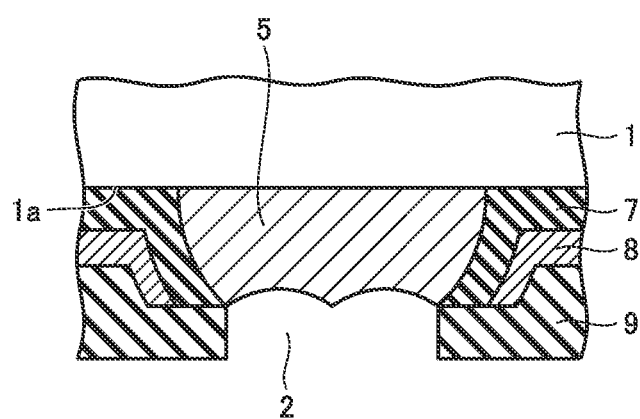
FIG. 19 is an enlarged view of a Z3 portion in FIG. 18.

FIG. 19 shows a Z3 portion in FIG. 18 as being enlarged. In a portion where a part of signal bump electrode 5 is removed by laser machining, irregularities are formed in the surface of signal bump electrode 5. These irregularities are traces of laser machining.

For example, a method of applying a solder paste on a side of substrate 10 and thereafter mounting an electronic component followed by reflow is available as a method of mounting an electronic component on substrate 10 for forming module 201 shown in FIG. 5. Presence of irregularities in the surface of signal bump electrode 5 increases an area of contact between signal bump electrode 5 and the solder paste. Therefore, signal bump electrode 5 and the solder paste are more reliably joined to each other and reliability in joint between the electronic component and substrate 10 is improved.

According to the manufacturing method in the present embodiment, the electronic component constructed as described in the first embodiment can be obtained. Specifically, the electronic component capable of cutting off noise generated from the substrate can be obtained.

In this manufacturing method, since the step of removing a part of signal bump electrode 5 to dig down by laser machining is ultimately performed, signal bump electrode 5 does not have to be exposed immediately after grinding.

Furthermore, as described with reference to FIG. 16 in the fifth embodiment, second shield film 18 may be formed to cover the upper surface and the side surface of electronic component main body 1 in this electronic component.

Some features in the embodiments above may be adopted as being combined as appropriate.

The embodiments disclosed herein are illustrative and non-restrictive in every respect. The scope of the present disclosure is defined by the terms of the claims and is intended to include any modifications within the scope and meaning equivalent to the terms of the claims.

1 electronic component main body; 1*a* first surface; 2 opening; 3 component; 5 signal bump electrode; 6 ground bump electrode; 7 first insulating film; 8 first shield film; 18 second shield film; 9 second insulating film; 10 substrate; 12 signal line; 13 ground line; 14 ground via conductor; 15 signal electrode; 16 ground electrode; 17 signal via conductor; 20 sealing resin; 21, 22 solder; 25 ink jet nozzle; 26 resin droplet; 27 sacrificial layer; 28 photomask; 29 laser beam; 91 arrow (representing propagation of noise); 101, 102, 103, 104 electronic component; 201 module

The invention claimed is:

1. An electronic component comprising:
   an electronic component main body including a first surface;
   a signal bump electrode arranged on the first surface to protrude from the first surface of the electronic component main body; and
   a protective film provided with an opening through which a part of the signal bump electrode is exposed, the protective film being arranged to cover a portion of the signal bump electrode other than a portion exposed through the opening, wherein
   the protective film includes a first insulating film, a second insulating film covering the first insulating film, and a first shield film arranged as lying between the first insulating film and the second insulating film, and
   the first shield film is covered with at least one of the first insulating film and the second insulating film so as not to be exposed at an inner surface of the opening.

2. The electronic component according to claim 1, comprising a ground bump electrode connected to a portion of the electronic component main body to be set to a ground potential and arranged to protrude from the first surface, wherein
   the first shield film is electrically connected to the ground bump electrode.

3. The electronic component according to claim 2, wherein
   a distance between an end of the first shield film closest to the opening and the first surface is longer than a distance between a point of the signal bump electrode most distant from the first surface and the first surface.

4. The electronic component according to claim 2, wherein
   when the signal bump electrode and the protective film are viewed in a direction perpendicular to the first surface, the signal bump electrode and the first shield film includes an overlapping portion.

5. The electronic component according to claim 2, wherein
   the electronic component main body includes an upper surface and a side surface, and the upper surface and the side surface are covered with a second shield film.

6. A module comprising:
   a substrate including a signal electrode and a ground electrode; and
   the electronic component according to claim 2, wherein
   the signal bump electrode exposed through the opening in the electronic component is electrically connected to the signal electrode and the first shield film is electrically connected to the ground electrode.

7. The electronic component according to claim 1, wherein
   a distance between an end of the first shield film closest to the opening and the first surface is longer than a distance between a point of the signal bump electrode most distant from the first surface and the first surface.

8. The electronic component according to claim 7, wherein
when the signal bump electrode and the protective film are viewed in a direction perpendicular to the first surface, the signal bump electrode and the first shield film includes an overlapping portion.

9. The electronic component according to claim 7, wherein
the electronic component main body includes an upper surface and a side surface, and the upper surface and the side surface are covered with a second shield film.

10. A module comprising:
a substrate including a signal electrode and a ground electrode; and
the electronic component according to claim 7, wherein
the signal bump electrode exposed through the opening in the electronic component is electrically connected to the signal electrode and the first shield film is electrically connected to the ground electrode.

11. The electronic component according to claim 1, wherein
when the signal bump electrode and the protective film are viewed in a direction perpendicular to the first surface, the signal bump electrode and the first shield film includes an overlapping portion.

12. The electronic component according to claim 11, wherein
the electronic component main body includes an upper surface and a side surface, and the upper surface and the side surface are covered with a second shield film.

13. A module comprising:
a substrate including a signal electrode and a ground electrode; and
the electronic component according to claim 11, wherein
the signal bump electrode exposed through the opening in the electronic component is electrically connected to the signal electrode and the first shield film is electrically connected to the ground electrode.

14. The electronic component according to claim 1, wherein
the electronic component main body includes an upper surface and a side surface, and the upper surface and the side surface are covered with a second shield film.

15. A module comprising:
a substrate including a signal electrode and a ground electrode; and
the electronic component according to claim 14, wherein
the signal bump electrode exposed through the opening in the electronic component is electrically connected to the signal electrode and the first shield film is electrically connected to the ground electrode.

16. A module comprising:
a substrate including a signal electrode and a ground electrode; and
the electronic component according to claim 1, wherein
the signal bump electrode exposed through the opening in the electronic component is electrically connected to the signal electrode and the first shield film is electrically connected to the ground electrode.

17. A method of manufacturing an electronic component comprising:
preparing a first structure body including an electronic component main body and a signal bump electrode, the electronic component main body including a first surface, and the signal bump electrode being arranged on the first surface to protrude from the first surface of the electronic component main body;
forming a first insulating film to cover the first surface of the first structure body and the signal bump electrode;
forming a first shield film to cover the first insulating film;
performing grinding so as to expose a part of the signal bump electrode;
arranging a sacrificial layer to cover an exposed portion of the signal bump electrode;
forming a second insulating film to cover the first shield film and the sacrificial layer; and
partially exposing the signal bump electrode by removing a portion of the second insulating film superimposed on the sacrificial layer and the sacrificial layer.

18. A method of manufacturing an electronic component comprising:
preparing a first structure body including an electronic component main body and a signal bump electrode, the electronic component main body including a first surface, and the signal bump electrode being arranged on the first surface to protrude from the first surface of the electronic component main body;
forming a first insulating film to cover the first surface of the first structure body and the signal bump electrode;
forming a first shield film to cover the first insulating film;
performing grinding so as to expose a part of the signal bump electrode;
forming a second insulating film to cover the first shield film and an exposed portion of the signal bump electrode; and
partially exposing the signal bump electrode by partially removing the second insulating film with laser machining.

* * * * *